(12) United States Patent
Nazarian et al.

(10) Patent No.: US 8,296,626 B2
(45) Date of Patent: Oct. 23, 2012

(54) ERROR CORRECTION FOR FLASH MEMORY

(75) Inventors: Hagop Nazarian, San Jose, CA (US); Ping Hou, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 1020 days.

(21) Appl. No.: 12/267,017

(22) Filed: Nov. 7, 2008

(65) Prior Publication Data
US 2010/0122146 A1 May 13, 2010

(51) Int. Cl.
*G11C 29/00* (2006.01)
(52) U.S. Cl. .................... 714/763; 365/185.09
(58) Field of Classification Search .............. 714/763; 365/185.09
See application file for complete search history.

(56) References Cited

U.S. PATENT DOCUMENTS

| | | | |
|---|---|---|---|
| 2007/0086239 A1* | 4/2007 | Litsyn et al. | 365/185.03 |
| 2008/0056005 A1* | 3/2008 | Aritome | 365/185.21 |
| 2008/0192544 A1* | 8/2008 | Berman et al. | 365/185.09 |
| 2009/0144600 A1* | 6/2009 | Perlmutter et al. | 714/763 |
| 2010/0235715 A1* | 9/2010 | Thatcher et al. | 714/763 |

* cited by examiner

*Primary Examiner* — Philip Guyton
(74) *Attorney, Agent, or Firm* — Turocy & Watson, LLP

(57) ABSTRACT

Providing for single and multi-bit error correction of electronic memory is described herein. As an example, error correction can be accomplished by establishing a suspect region between bit level distributions of a set of analyzed memory cells. The suspect region can define potential error bits for the distributions. If a bit error is detected for the distributions, error correction can first be applied to the potential error bits in the suspect region. By identifying suspected error bits and limiting initial error correction to such identified bits, complexities involved in applying error correction to all bits of the distributions can be mitigated or avoided, improving efficiency of bit error corrections for electronic memory.

20 Claims, 11 Drawing Sheets

ERROR CORRECTION FOR FLASH MEMORY

BACKGROUND

Memory devices have a wide variety of uses in modern electronics, including computers, cameras, voice recorders, cell phones, portable storage drives, and similar devices. In addition, many types of memory devices have been developed to effectuate such uses. Flash memory, for example, is one type of electronic memory media that can store, erase and restore data. Furthermore, Flash memory is non-volatile, unlike some types of electronic memory, and thus Flash memory can retain stored data without a continuous source of electrical power. Flash memory has become a popular device for consumer electronics, due in part to a combination of the high density and low cost of erasable programmable read only memory (EPROM) and electrical erasability introduced with electronically erasable programmable read only memory (EEPROM). Because Flash memory is non-volatile and compatible with many electronic devices, users can readily transport data stored on Flash and swap such data among various devices. Thus, a user can take a picture on a digital camera, store the picture digitally on a Flash cartridge, remove the Flash cartridge from the camera and insert it into a digital image viewer (e.g., connected to a television), or onto a computer to view the picture, edit the picture in software, upload the picture to a remote web server, share the picture via e-mail, and so on. Because of the versatility of non-volatile electrically erasable memory, Flash and other such memory have become a useful and popular mechanism for storing, transporting, sharing and maintaining data.

To further increase storage density (e.g., number of storable bits per unit area or volume), modern memory cells can store multiple bits. Such cells are also referred to as multi-level cells. Single-level cells each store only a single bit of information, by programming the cell, or leaving the cell un-programmed. Multi-level cells, on the other hand, can store multiple bits of information by programming the cell to multiple levels. For instance, a cell that can maintain three distinct program levels (e.g., erased, first program level, second program level, and third program level) can store two bits of information. In addition to the foregoing, mirror cell technology enables a single memory cell to contain two neighboring memory cells. Thus, storage density can be greatly increased by utilizing multi-bit mirror cells on a single memory die.

The advent of multi-bit memory cells adds complexity to memory design. For instance, retention charge loss or charge gain can impact the state of the multi level cells and cause errors during read operation. Also, a bit of a memory cell can affect, and be affected by, bit levels of a neighboring mirror cell. Thus, for instance, if one cell is un-programmed and the neighboring cell is programmed to a high level, the relative disparity in stored charge between the neighboring cells can increase stored charge of the un-programmed cell (or, e.g., decrease the stored charge depending on erase/program convention) and decrease stored charge of the programmed cell. Over time, this phenomenon can lead to errors, where a cell programmed to one bit state (e.g., a second program level), loses/gains enough charge so as to be indistinguishable from another bit state (e.g., a first program level). As another example of added complexity, error detection and correction algorithms, relatively simple for single-bit errors, can become very complicated for multi-bit errors. Increased memory density can sometimes result in more multi-bit errors, requiring use of complicated, and time consuming, detection/correction algorithms. Accordingly, mechanisms to speed up error detection/correction and minimize the resources used can be helpful.

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The subject disclosure provides for error correction of electronic memory. As an example, error correction can be accomplished by establishing a suspect region in between bit level distributions of two memory bit states. The suspect region defines potential error bits with respect to a primary bit level reference. If a bit error is detected for the distributions, error correction is first applied to the potential error bits in the suspect region. In some circumstances, identifying and analyzing suspect bits can reduce complexity and time required to correct identified errors.

In some aspects of the disclosure, a bit swapping algorithm is employed to correct error bits. The bit swapping algorithm can be configured to change a logical association of a bit from a first bit state (e.g., unprogrammed) to a second bit state (e.g., programmed). Thus, where a bit level of a memory cell or block of data is measured to be outside of a particular bit state level range, changing logical association of the memory cell/data block can correct a measured error. In some aspects, the swapping algorithm can swap a subset of suspect bits to and from, respectively, the first and second bit states.

According to other aspects of the disclosure, a swapping algorithm can be iteratively applied to a subset of suspected error bits to correct bit errors. In at least one such aspect, the swapping algorithm can be applied to different subsets of the suspected error bits until no errors are determined. Bit selection algorithms described herein can correct errors in $2^{\wedge S}$ or fewer swap operations, where S is a number of suspected error bits. In at least one other aspect, selection of suspect bits for swapping can be based on feedback data and optimization. For instance, a number of remaining error bits can be determined in between each swapping instance. The remaining number can be used to determine whether a correct subset of suspected error bits was chosen in such instance. Furthermore, results of a swapping instance can be stored and utilized to inform subsequent instances, potentially reducing a number of swapping instances required to correct errors.

In addition to the foregoing aspects, a probability of error can be assigned to one or more suspect bits to provide a hierarchy of error for such bits. Bit selection algorithms can select subsets of suspected error bits having a higher likelihood of error prior to lower probability error bits. Such an arrangement can reduce a number of correction instances required to reduce or eliminate errors. By iteratively swapping a subset of suspected bits, identifying a number of remaining errors, optionally reversing a swapping instance, and choosing other subsets of suspected bits, error correction optimization can iteratively reduce or eliminate bit errors for a cell or group of cells.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and novel features of the disclosed subject matter will become apparent from the following detailed description of the innovation when considered in conjunction with the drawings.

DETAILED DESCRIPTION

Figure 1:
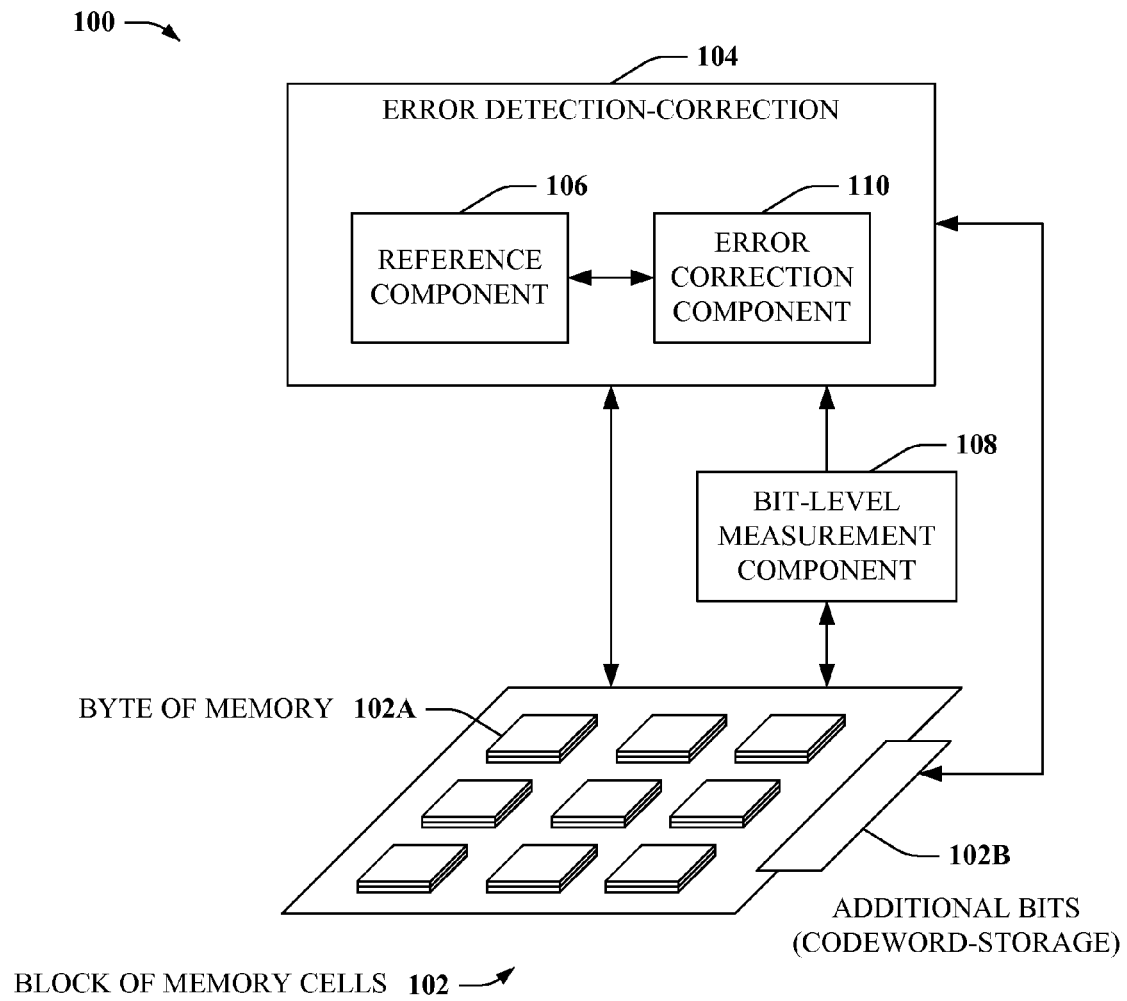
FIG. 1 depicts a block diagram of an example system that corrects bit errors of electronic memory according to aspects disclosed herein.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

As utilized herein, terms "component," "system," "interface," "engine," and the like are intended to refer to a computer-related entity, either hardware, a combination of hardware and software, software (e.g., in execution), and/or firmware. For example, a component can be a process running on a processor, a processor, an object, an executable, a program, and/or a computer. By way of illustration, both an application running on a server and the server can be a component. One or more components can reside within a process and/or thread of execution and a component can be localized on one computer and/or distributed between two or more computers. As another example, an interface can include I/O components as well as associated processor, application and/or API components, and can be as simple as a command line or a more complex Integrated Development Environment (IDE).

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Of course, those skilled in the art will recognize many modifications may be made to this configuration without departing from the scope or spirit of the claimed subject matter.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application and the appended claims, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Various forms of electronic memory (e.g., Flash memory, RAM, disc and/or disk drives, etc.) utilize small cells and/or blocks of data that can be utilized to digitally store information. A memory device typically has many bits, each having a plurality of bit-level states that correspond to digital bits, digital words (in the case of multi-level cells/blocks [MLCs]), or the like. Each bit-level state in conjunction with an erased state represents a distinct instance of data, as is known in the art of digital data storage. For instance, a single-level cell (SLC) or single-level block comprises a single bit having two distinct bit-level states. Each bit-level state is characterized by a distinct level (or, e.g., a distinct range) of a measurable electronic quantity such as stored charge, current, voltage, and so on. Memory device conventions relate the distinct levels/ranges to un-programmed and programmed states. As an example for volatile or non-volatile memory cell devices, one such convention could state that a bit comprising stored charge in the range of 0.1 to 0.3 micro-coulombs ($\mu C$) is in an un-programmed state, whereas if the bit comprises stored charge from 0.5 to 0.7 $\mu C$, the bit is in a programmed state. The region between 0.3 and 0.5 $\mu C$ can be undefined, or simply defined as programmed or un-programmed upon measurement. (E.G., by selecting a reference point during measurement between 0.3 and 0.5 $\mu C$ and determining that bit levels over the reference are programmed and bit levels under the reference are unprogrammed). As another example for optical discs, another convention could state that a mark, hole, divot, etc., made on the surface of the optical disc, within a predetermined area of the disc for instance, can represent a programmed bit, whereas the area could represent a non-programmed state if the area does not contain the mark/hole/divot. Thus, in general, by measuring an amount of charge (or, e.g., voltage, current, etc.), stored by a bit at a given point in time, whether the divot is burned into a bit-area (for optical discs), whether a section of a magnetic tape drives contains a predetermined level of charge, whether a block of a hard disc contains a predetermined level of charge or voltage, and so forth, a bit-level state of the bit can be determined. Such determination is equivalent to 'reading' the data of the bit.

Unfortunately, data stored in memory devices can decay over time. Such a result can occur when programmed (or erased/un-programmed) bit-level states drift outside of a conventional value/range (e.g., in the case of a memory cell). Thus, as time progresses, environment conditions change (e.g., humidity increases/decreases) and operations of a memory device are conducted (e.g., read, write, re-write and/or refresh operations in the tens of thousands can affect stored bit-levels), memory cell bit-levels can drift over time. If a bit-level drifts too far from a conventional state (e.g., from 0.3 µC to 0.5 µC), an intended bit-level state of the bit might be indistinguishable from a neighboring bit-level state, leading to a read error. Where the read error is unable to be detected and corrected, some aspect of stored data is lost. Accordingly, detection and correction of memory cell errors is one way to provide integrity of digitally stored data.

The subject disclosure provides for identifying and correcting single or multi-bit errors of an electronic or magnetic memory device. A suspect region can be established between two bit level distributions of the memory device. The suspect region can define suspected error bits (e.g., via measured bit levels of such bits). Thus, bit levels falling within the suspect region can be classified as suspected errors. Error correction algorithms can be applied to the suspected error bits in order to reduce complexities involved in analyzing each bit of one or more distributions (which can comprise hundreds or thousands of bits, or in some cases many more). Where multiple suspected error bits are identified, intelligent bit selection and optimization is provided to reduce average iterations required to successfully correct errors within the suspect region. For errors that exist outside of the suspect region, a bit level range of the suspect region can be optimized to try and capture such errors within the suspect region. Alternatively or in addition, Hamming code ECC, or extended Hamming code ECC, Reed-Solomon (RS) code or a Bose, Ray-Chaudhuri, Hocquenghem (BCH) code can be employed to correct errors not captured by the suspect region. As utilized herein, Hamming code ECC (or, e.g., Hamming code) refers to algorithms for detecting and correcting single-bit errors. On the other hand, extended Hamming code ECC (or, e.g., extended Hamming code) refers to algorithms for detecting up to two bit errors and correcting single bit errors. Such codes can be relatively complex for general multi-bit error correction; however, by utilizing such codes to supplement suspect region correction, overall error correction can be greatly simplified.

In at least some aspects of the subject disclosure, a refresh operation can be employed in conjunction with an ECC code or swapping code for error correction. Thus, for instance, an identified error bit can be re-programmed to a default bit level state, or refreshed, to correct the error. As an illustrative example, if a bit has a charge level measuring at 0.3 µC, and a default program charge level is 0.5 µC, the bit can be re-programmed back to 0.5 µC to 'refresh' the bit. Refreshing can be done in conjunction with swapping logical association of bits and employing an ECC for bit correction. For instance, if a bit error has a charge level that is within a charge level distribution of a different bit state (e.g., if 0.3 µC is within a range for an un-programmed bit in the foregoing example), it might be beneficial to refresh the bit instead of simply swapping logical association. Accordingly, refresh can be implemented to bring the bit charge back to an appropriate program level, to obviate the error.

Referring now to the drawings, FIG. 1 depicts a block diagram of an example system 100 that provides error correction for a memory device 102 according to aspects of the subject disclosure. System 100 comprises an error detection-correction component 104 that can identify and analyze suspected error bits of the memory device 102. By identifying suspected errors, typical complexities in error detection/correction can be avoided in many circumstances, as discussed in more detail below. Identifying suspected error bits is accomplished at least in part by generating a suspect region between bit level distributions of the memory device 102 (e.g., see FIG. 2, infra, for an illustration of two distinct bit level distributions and an explanation thereof). The suspect region enables fast identification of bits most likely to be errors, reducing overhead analysis even for multi-bit errors. Accordingly, significant calculation efficiency can be achieved in error correction, as well as reduced overhead storage (102B) in some circumstances.

Memory device 102 includes a block of memory cells each comprising multiple bytes of memory 102A. The various bytes 102A comprise bits (e.g., SLCs, MLCs, mirror cells, etc.) having various bit-level states (e.g., programmed, un-programmed). Multiple bits in a particular state will create one distribution of bit-levels and multiple bits in a different state will create a different distribution of bit-levels (see FIG. 2, infra). When a bit has a bit-level that falls outside of a respective distribution, it becomes more likely to be or eventually become an error. Accordingly, by monitoring and analyzing the bits that fall outside of the distributions (or bits that cause a distribution to extend significantly toward another distribution), bits having higher probability of error can be corrected first.

Reference component 106 can generate a region between two bit-level distributions for identifying suspected error bits, termed a suspect region as used hereinafter. As utilized herein, the terms suspected error bit or potential error bit refer to a bit having a bit level that falls within the generated suspect region. In addition, suspected/potential error bits (falling within the suspect region) that are not errors, are termed herein as marginal bits, marginal error bits, or non-error suspect bits. Further to the above, the term non-suspect error bit is utilized herein to refer to an error bit having a bit level that does not fall within the defined suspect region.

Where bit-level distributions overlap (e.g., when suspected error bits are included as part of the distributions), a suspect region can be established at a suitable point between the respective distribution peaks, such as at an absolute minima point or a local minima point, for instance. The region can be created utilizing a plurality of reference comparators. For instance, two reference comparators can be established at a finite bit-level distance from each other (e.g., the finite distance measured in µC, milli-volts (mv), micro-amps, etc.), resulting in a finite-width bit-level region. The region(s) generated by reference component 106 is termed a suspect region(s) herein, since bits falling within such region are more likely to be errors than bits outside of this region, although not to a certainty. A measurement component 108 can measure bit-levels of memory device 102, and those bits having bit-levels within the suspect region(s) can be classified as suspected error bits.

In at least one aspect of the subject disclosure, a reference comparator utilized by the reference component 106 can be established as an active reference. The active reference can be utilized to determine whether a bit is an error bit. For instance, continuing the foregoing example, a non-program state corresponds to 0.1 to 0.3 µC stored charge and a program state corresponds to 0.5 to 0.7 µC stored charge. Choosing an active reference to be at 0.4 µC implies that program bits having bit-levels below 0.4 µC (e.g., determined by bit-level measurement component 108) are error bits, and non-program bits having bit-levels greater than 0.4 µC are also error bits. If reference component 106 establishes a suspect region at 0.35 µC to 0.45 µC, then where a bit-level of a non-program bit (bit-level$_{NP}$) is measured 0.35 µC≦bit-level$_{NP}$<0.4 µC such non-program bit is a suspect error bit but not an error bit. Likewise, where a bit-level of a program bit (bit-level$_P$) is measured 0.4 µC<bit-level$_P$≦0.45 µC such program bit is also a suspect error bit but not an error bit. As will be described in more detail hereinafter (e.g., see FIG. 6, infra), optimizing the position and width of the suspect region, as well as the position of the active reference, can be utilized to reduce error bits.

In addition to the foregoing, error detection-correction component 104 can attempt to identify and/or correct existing errors. Thus, error detection-correction component 104 can utilize a Hamming code to identify whether one error exists or multiple errors exist. If only one error exists, the Hamming code can be employed to correct the error. If multiple errors exist, error detection-correction can first attempt to swap logical association of suspect region bits until one error is left then Hamming code is run to correct the last error. If the number of errors has been reduced, at least one swapped bit was an error. If the number of errors is not reduced the swapping operation can be reversed and a different subset of suspect bits swapped. Error detection-correction can repeat this process until no errors remain, or until all possible combinations are exhausted. If the latter occurs and no combination of error bits yield error-free results, error detection-correction component 104 can assume an error(s) is not contained in the suspect region, and employ other algorithms for correcting the non-suspect region bits (e.g., see FIG. 6, infra).

Alternatively, or in addition to the foregoing, a summing algorithm can be employed for error detection. The summing algorithm can be particularly useful for multi-bit errors, since extended Hamming code is limited to detecting two bit errors.

The summing algorithm establishes a baseline value for a particular program state of memory device 102. The baseline value can be stored in additional memory 102B associated with the memory device 102, or stored with a pre-determined number of bytes 102A (e.g., a block of bytes, a page of bytes) of such device 102. To implement error detection, error detection-correction component 104 can determine a contemporaneous read value of device 102 (or e.g., the page/block of the device) and compare the contemporaneous read value to the baseline value. If the comparison is identical, no errors occur. If the comparison is not identical, one or more error bits are present. As one example, a codeword can be generated by summing bit-levels of analyzed bits multiplied by a unique non-zero index of each such bit. The following formula is illustrative:

$$A_0 + 2A_1 + 3A_2 + \ldots (i+1)*A_i = \sum_{i=0}^{n}(i+1)A_1 = CW_P,$$

where i is a non-negative integer, A is a bit-level state (e.g., 0, 1, 2, etc.) of the i$^{th}$ bit, and where CW$_P$ is a program codeword (e.g., a codeword generated when memory device 102 is programmed). In contrast, a codeword generated during read is termed CW$_R$. Thus, where CW$_P$=CW$_R$, the codeword at read is the same as the codeword at program, and no errors exist. Likewise, where CW$_P$≠CW$_R$, at least one error exists for memory cells associated with the codeword.

Further to the above, CW$_R$ can be obtained from the following formula:

$$\sum_{j=0}^{n-S}(ns_j+1)A_j + \sum_{j=0}^{S}(s_j+1)A_{S_j} = CW_R,$$

where n is a number of bits in the codeword, S is a number of suspect bits, ns$_j$ is a non-negative integer index of the j$^{th}$ non-suspect bit, A$_j$ is the bit-level state of the j$^{th}$ non-suspect bit, s$_j$ is a non-negative integer index of the j$^{th}$ suspect bit, and A$_{S_j}$ is the bit-level state of the j$^{th}$ suspect bit. Thus, where an analyzed set of six bits contains three non-suspect bits having non-suspect indices (ns$_j$) 0, 2 and 5, and three suspect bits having suspect indices (s$_j$) 1, 3, and 4, for example, CW$_R$=(A$_0$+3A$_2$+6A$_5$)+(2A$_1$+4A$_3$+5A$_4$).

The formula CW$_R$−CW$_P$=Delta can be utilized to determine whether any errors exist at read. If Delta=0, no errors exist. If Delta≠0, at least one error exists. Additionally, a number of errors can be determined, at least within a finite number of possible solutions, based on a value of Delta, measured bit state levels and bit indices. Thus, for instance, if Delta=1, and the minimum index value is 1, it can be uniquely determined that only one error bit exists, A$_0$. If, on the other hand, Delta=−6, and measured bit-level states for SLC cells are measured (e.g., by bit-level measurement component 108) as follows: A$_0$, A$_1$, A$_2$, A$_3$, A$_4$, A$_5$=0, 1, 1, 0, 1, 0—resulting in CW$_R$=(0+3+0)+(2+4+0), it can be determined that there are two potential sets of errors: A$_0$ and A$_4$ could both be errors, or A$_5$ could be a lone error, but no other combinations of errors yield Delta=−6. As another example, if Delta=+6, then it can uniquely be determined that A$_1$ and A$_3$ are both errors. Although this simplistic analysis with 6 SLC bits is relatively straightforward, as a number of examined bits becomes larger, the number of possible errors can become great, increasing complexity of calculations. Complexity can be greatly enhanced for MLCs as well, where a bit can have three, four or more potential bit-levels.

To reduce error detection complexity, codeword generation can be applied only to suspect bits. Stated another way, it can be assumed that non-suspect bits are correct, and that a subset of the suspect bits correspond to any identified errors. Once it is identified that errors exists, a selected subset of suspect bits can be corrected, by swapping logical association of the selected subset. Error detection can be initiated after swapping the subset to determine whether any errors remain (or, e.g., whether a number of existing errors has increased or decreased in some aspects). In one aspect of the subject disclosure, all possible subsets of the bits can be swapped to determine which subset yields the correct results. This requires 2$^S$ swapping operations to exhaust all possible subsets, and identify the best result. In other aspects, machine learning (ML) can be employed to analyze information about prior swapped subsets to inform subsequent selection of subsets. Depending on the effectiveness of the ML, fewer than 2$^S$ swapping operations could result in the fewest errors. Where zero errors result, error detection-correction 104 can terminate iterative selection/swapping and analysis. However, where an error exists outside of the suspect region, error detection-correction component 104 can revert to an identified best swapping result (e.g., yielding the fewest errors) and optimize the suspect region (e.g., to try and capture more bits within such region) and/or employ complex algorithms (e.g., RS algorithm or BCH algorithm) that analyze the entire distributions to correct any remaining errors. However, it should be appreciated that the efficiency of the complex algorithms can be greatly enhanced by error detection-correction component 104 by first correcting errors within the suspect region, as discussed above, reducing overall number of errors to be corrected by the RS or BCH algorithm(s).

In addition to the foregoing, it should be appreciated that memory device 102 can include various types of memory. Examples can include non-volatile memory such as Flash memory, read only memory (ROM), programmable read only memory (PROM), erasable programmable read only memory (EPROM), electronically erasable programmable read only memory (EEPROM), and so on. In some aspects, memory device 102 can include volatile memory such as random access memory (RAM), dynamic random access memory (DRAM), and the like. Additionally, the electronic memory device can comprise single-level cell (SLC) technology, multi-level cell (MLC) technology, NOR Flash, NAND Flash, MirrorBit® technology, or like memory technology.

Figure 2:
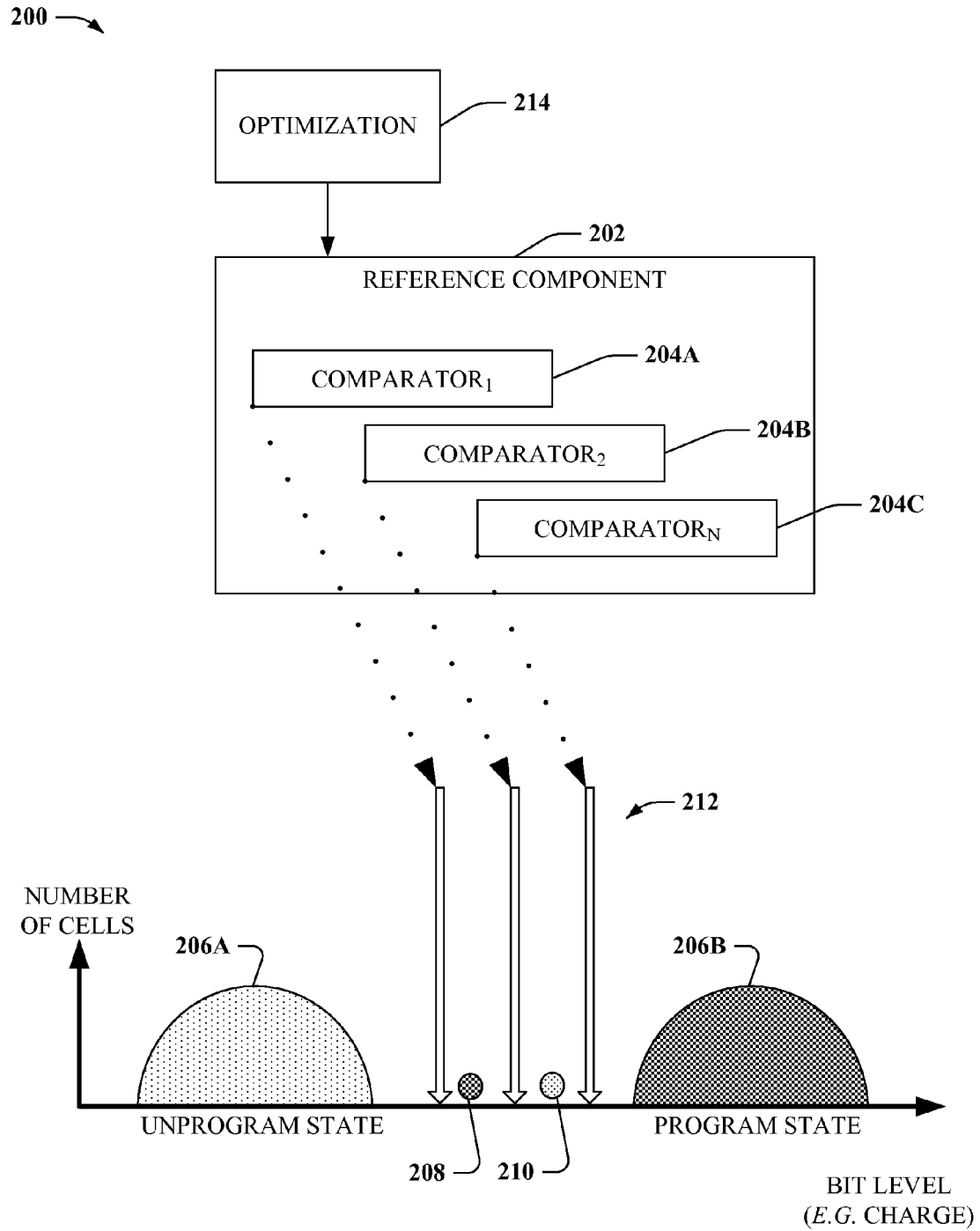
FIG. 2 illustrates a block diagram of an example system that establishes a suspect region between bit distributions of a memory device.

FIG. 2 depicts a block diagram of an example system 200 comprising a reference component 202 according to aspects of the subject disclosure. Reference component 202 can employ a plurality of reference comparators 204A, 204B, 204C to establish bit-level references for measuring bit-level states of a memory device. Such measurement can be beneficial in determining integrity of stored data. For instance, if a bit-level of one or more bits drifts over time, portions of stored data can be lost. Measuring and comparing a contemporaneous bit-level state with a state at programming can help to determine whether data has been lost since the memory device was last programmed.

As depicted by FIG. 2, memory cells of an SLC device are graphed as a function of numbers of cells versus measured bit-level (e.g., stored charge, current, voltage, etc.). The graph depicts two bit level distributions 206A, 206B for the measured cells, which correspond to two different bit-level states, an un-programmed state (e.g., a digital 1) and a programmed state (e.g., a digital 0), respectively. Also depicted are two bits (206, 208) that have drifted outside of each of the distributions 206A, 206B into a central region between such distributions 206A, 206B. Additionally, the region between the distributions 206A, 206B include three references 212, each established by one of the reference comparators 204A, 204B, 204C. The references 212 provide a suspect region between the bit distributions 206A, 206B. Bits (208, 210) falling within the suspect region are classified as suspected error bits because, having close proximity to a cut-off between bit states (e.g., provided by an active reference, such as the middle of the three references 212 established by comparators 204B), the suspect bits are more likely to be errors. To illustrate, an un-programmed bit (210) on the right side of the bit state cut-off (212, 204B) would be an error bit, and a programmed bit (208) on the left side of such bit state cut-off (212, 204B) would also be an error bit. Thus, bits closer to the cut-off typically have higher probability of becoming errors.

Bits 208, 210 are within the suspect region (212), and thus are suspected error bits, or suspect bits, as well as errors (assuming the middle reference 212, 204B is the active reference, or bit state cut-off). It should be understood that not all suspect bits are error bits. For instance, if un-programmed bit 210 falls within the suspect region (212) but is on the left side of the active reference (212, 204B), bit 210 is suspect but not an error. Likewise, if programmed bit 208 falls within the suspect region (212) but is on the right side of the active reference (212, 204B), bit 208 is also not an error bit. As used herein, suspect bits that are not errors are termed marginal bits.

According to other aspects of the subject disclosure, system 200 can comprise an optimization component 214 that can optimize the suspect region (212) based on error detection/correction requirements. Optimization can be accomplished by varying bit-levels of the reference comparators 204A, 204B, 204C (to adjust relative positions of the references 212 on the bit-level graph). Thus, the suspect region (212) can be widened, narrowed, shifted left and/or shifted right by adjusting the various comparators 204A, 204B, 204C. Optimization of the suspect region (212) can be utilized to increase, decrease or otherwise modify the suspect bits (208, 210) within the suspect region (212). Such a result can be beneficial, for instance, to increase or decrease complexity of suspect region error correction. As an example, if error correction as described herein fails to correct all errors by manipulating suspect bits (208, 210) (e.g., swapping logical association), the suspect region (212) can be widened to capture more bits. As another example, if many bits (208, 210) are within the suspect region and error detection/correction is complex and therefore slow, the suspect region (212) can be narrowed to decrease calculation time/reduce complexity. It should also be appreciated that the suspect region (212) can be shifted left and/or right between the distributions 206A, 206B to modify a set of suspect bits (208, 210). Additionally, it should be appreciated that other optimization known in the art or made known to one of skill in the art by way of the context provided herein, is incorporated into the subject disclosure.

Figure 3:
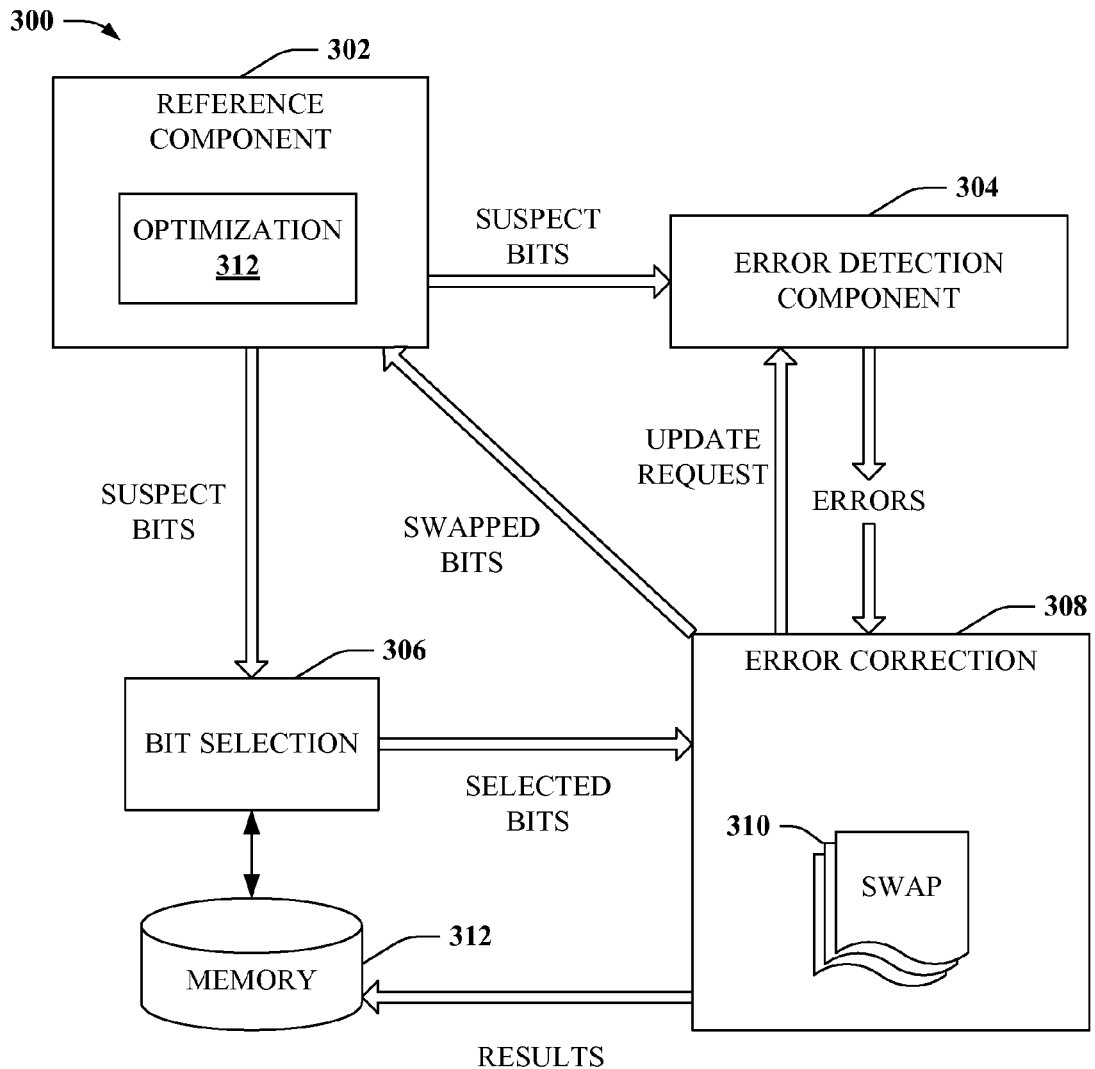
FIG. 3 depicts a block diagram of a sample system for correcting multi-bit memory errors according to some aspects of the subject disclosure.

FIG. 3 illustrates a block diagram of an example system 300 that facilitates multi-bit error correction for electronic memory. Error correction utilizes a suspect region between measured bit-level distributions of a group of memory cells (e.g., a page of cells). The suspect region is utilized to identify bit-levels that have a relatively high probability of being errors. Error correction can first be applied to suspect region bits to reduce complexity involved in multi-cell and multi-bit errors. If manipulating suspect region bits corrects all bit errors, then more complex correction algorithms can be avoided.

System 300 comprises a reference component 302 that establishes the suspect region between bit-level distributions analyzed by system 300. In addition, reference component can obtain suspect bits having bit-levels within the suspect region. The suspect bits can be obtained from, for instance, a measurement device that determines bit-levels of various memory cells (e.g., see FIG. 1 at 108, supra). Reference component 302 can provide the suspect bits to an error detection component 304 and/or a bit selection component 306.

Error detection component 304 determines whether any analyzed bits are in fact errors. The determination can be made with respect to an active reference that establishes a cut-off between a first bit-level state and a second bit-level state (e.g., see FIG. 2, supra). Errors can be determining utilizing Hamming code, a summation code, as described herein (e.g., see FIG. 1, supra), an RS code, BCH code, or a like algorithm, or a combination thereof. In some aspects, a number of existing errors can further be determined by error detection component 304. Existence of errors, and optionally number of errors where suitable, are provided by error detection component 304 to error correction component 308.

Bit selection component 306 obtains the suspect bits from reference component 302 and selects a subset of the suspect bits for correction. The selected subset can be based on various factors. In some aspects, the subset can be selected to reduce a number of correction instances required to correct or minimize bit errors. In other aspects, the subset can be selected to reduce complexity of error correction. As a particular example, suspect bits can be given a probability of error. Suspect bits having highest probability of being errors can be selected for correction prior to bits having lower probability of error. Various information can be utilized to establish probability of error, including bit level or bit-level state of a bit, suspect region zone(s), and/or physical properties of a memory device (e.g., see FIG. 5 for more detailed examples). Once a subset of suspect bits is selected for correction, bit selection provides the subset to error correction component 308

According to at least one aspect, bit selection component 306 can store selected subsets of suspect bits. By referencing previous selected subsets, bit selection 306 can iteratively select different subsets until all possible subsets are exhausted. Thus, for instance, if three suspect bits are provided to bit selection 306, seven unique subsets (1, 2, 3, ½, ⅓, ⅔, and 1/2/3) of at least one bit are possible. By storing subsets provided to error correction 308, bit selection 306 can avoid repeating a previous subset, or can recall a previous subset requested by system 300. In at least one aspect, bit selection component 306 can obtain results of a prior correction/error analysis stored in memory 312. The results can include for instance, whether errors are associated with a particular subset, and optionally how many errors. Accordingly, by comparing subset combinations with results, bit selection 306 can determine a probability that a particular bit(s) or which subset(s) of the bits contain one or more errors. Bit selection component 306 can then attempt to choose subsets based on probability of correcting errors, based at least in part on the prior results.

Error correction component 308 obtains a subset of bits from bit selection 306. Additionally, error correction can obtain an error analysis from error detection component 304, indicating whether any errors exist, and in some aspects a number of such errors. Where the errors/number of errors are associated with a previous correction, results of the correction can be stored in memory 312, as discussed above. In some aspects, error correction component 308 can employ a Hamming algorithm to correct identified errors (e.g., where there is only one bit error). In other aspects (e.g., where more than one bit error exists), a swapping algorithm 310 can be employed to change a logical association of the subset of bits received from bit selection 306. Once logical associations of the selected bits are swapped, error correction component 308 can request an error update from error detection component 304. If no errors exist, error correction component 308 updates the result in memory 312, maintain the logical association, and output corrected data. If errors still exist, error-correction 308 can report the swapped bits to reference component 302, and optionally reverse the latest swapped bits (e.g., if more errors were found, an identical number of errors were found, or no numerical error data is obtained, or simply to test additional subsets of bits). Once the report is obtained at reference component 302, suspect bits can again be sent to error detection component 304 and bit selection 306 to initiate an additional instance of error detection, bit selection and correction.

In at least one aspect, reference component 302 can employ optimization 312 to adjust width and/or position of a suspect region, potentially obtaining a new set of suspect bits. If such is the case, the new set of suspect bits is provided to bit selection 306 and error detection component 304 as described above. Optimizing the suspect region can be helpful to include more or fewer suspect bits, depending on results of error correction. As described, system 300 can iteratively correct bit errors by employing the suspect region and selected subsets of suspect bits. Such an arrangement can provide efficient error correction for single or multi-bit errors.

Figure 4:
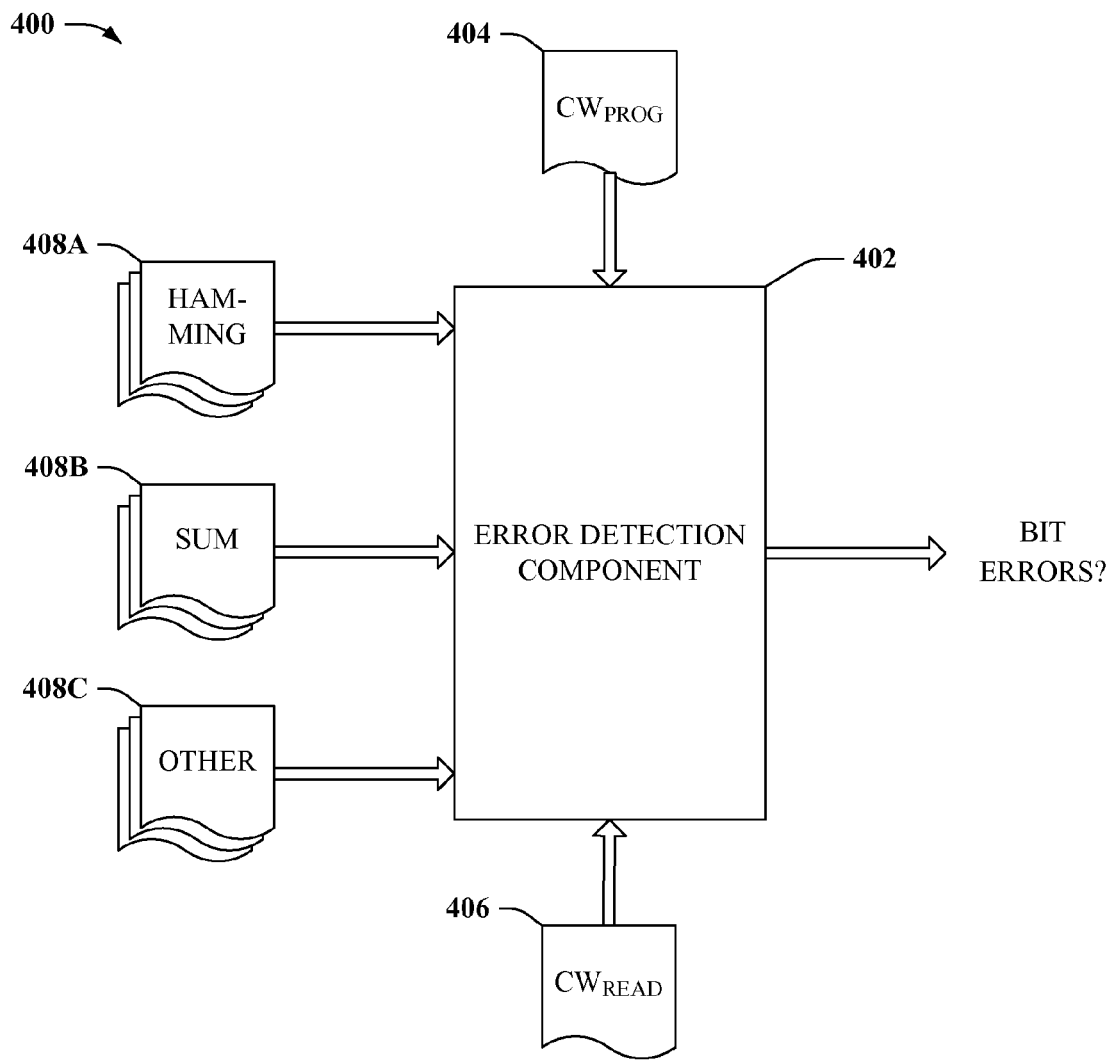
FIG. 4 illustrates a block diagram of an example system comprising an error detection component according to aspects of the subject disclosure.

FIG. 4 depicts a block diagram of an example system 400 configured to detect errors for electronic memory. An error detection component 402 can employ various algorithms (408A, 408B, 408C) in order to identify bit errors. In addition, error detection component 402 can detect single as well as multiple errors and report out an error status. In some aspects, error detection component 402 can also determine a number of error bits and report out the number as well.

In some aspects, error detection component 402 can employ an extended Hamming code 408A to obtain an initial report of errors for cells of a memory device. The extended Hamming code is suitable to identify one or more bit errors, and can also correct one bit error. If one error is detected, the extended Hamming code can be employed to correct the single bit error. If multiple errors are detected, error detection component 402 can output the multi-bit error status for correction, as described herein.

In other aspects, a summing algorithm 408B can be employed to identify a multi-bit error state. The summing code 408B can be employed to generate a programming codeword 404 that provides information about a state of analyzed bits at a particular point in time (e.g., when bits are programmed or immediately after such programming). Additionally, the summing code 408B can generate a second codeword 406 upon reading the analyzed bits. By comparing the codewords 404, 406, error detection component 402 can determine whether any errors exist. In some aspects, the summing code 408B can include distinct data for each analyzed bit (e.g., a distinct index of each bit) in a generated codeword. The distinct data can enable error detection component 402 to identify bits or groups of bits contributing to an error result. In such aspects, error detection component 402 can determine a number of bits, and potentially which bits, are errors. Where a single unique number of error bits cannot be obtained from the codewords and distinct data, error detection component 402 can attempt to determine a finite number of potential bits or groups of bits based on the data. By identifying error bits or potential error bits, error detection component 402 can reduce a number of iterations required to correct bit errors for electronic memory.

Figure 5:
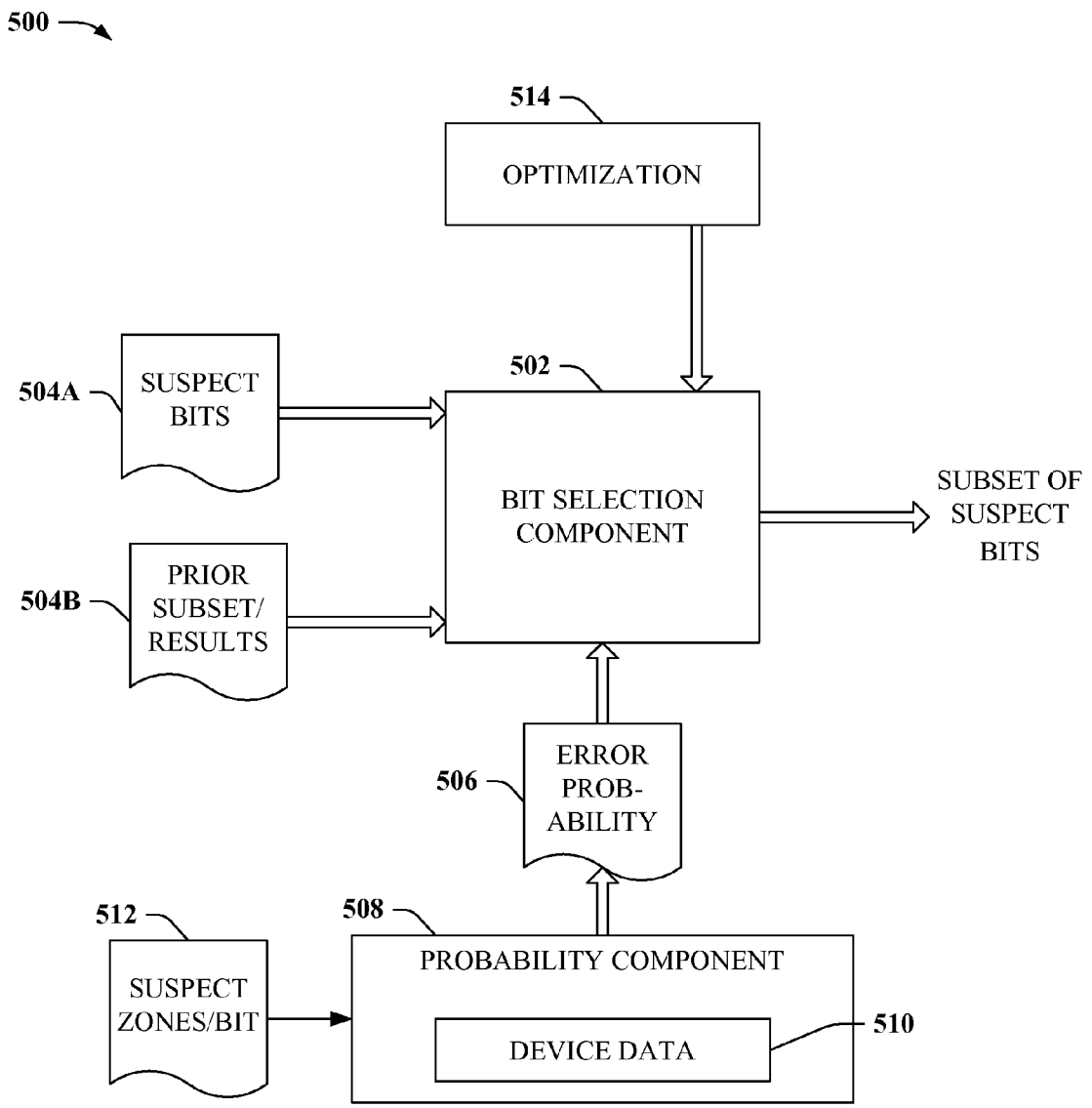
FIG. 5 depicts a block diagram of a sample system that selects a subset of suspected error bits for correction according to further aspects.

FIG. 5 depicts a block diagram of a sample system 500 that can facilitate efficient single or multi-bit error correction for electronic memory. System 500 comprises a bit-selection component 502 that obtains a set of bits, selects a subset of such bits and outputs the subset for correction. As described herein, the set of bits can comprise suspected error bits 504A determined from a suspect bit-level range established between bit-level distributions of the electronic memory. By employing selective subsets of suspect bits 504A for error correction, system 500 can reduce overhead calculations involved in bit error correction.

According to some aspects, bit selection component 502 can obtain a probability of error 506 for one or more suspect bits 504A. The probability of error 506 can be determined in several ways. As one example, a bit-level state of a bit can be utilized to establish and/or adjust a probability of error for the bit. For instance, a particular bit-level state could be more prone to error based on electronic, magnetic, and/or solid state characteristics of particular memory cells. A device data 510 file pertinent to a memory device and/or cells of such device can specify such characteristics and be utilized by probability component 508 to establish or adjust the error probability. Thus, as a particular example, device data 510 can specify that non-programmed bits are more prone to error than programmed bits (e.g., based on charge loss or gain). Thus, probability for error for a bit can be based at least in part on a measured bit-level state of the bit. As another particular example, device data 510 could indicate that mirror cells, NOR cells, NAND cells, or other specific memory technology is more or less prone to error. Accordingly, an error probability of a bit can be determined at least in part based on a type of technology of such bit.

In another case, probability component 508 can obtain suspect zone or sub-region information pertaining to received suspect bits 504A. Zones or sub-regions 512 of a suspect region can be established, for instance, by utilizing three or more reference comparators (e.g., see FIG. 2 or FIGS. 6A, 6B, 6C). Two outer comparators can establish the outer boundaries of the suspect region, whereas additional comparators between the outer boundaries can establish sub-regions within the suspect region. Furthermore, suspect bits 504A within particular sub-regions 512 can be assumed to have higher probability of being errors than bits within other sub-regions 512. As one example, sub-regions 512 adjacent to an active reference (utilized as a cut-off between two bit-level distributions) can be assumed to have highest probability of producing error bits. Thus, bits within the adjacent sub-regions (512) can be given a highest probability of error. Sub-regions (512) further from the active reference can be given lower probabilities of error. As another example, sub-regions (512) furthest from the active reference could be accorded a highest probability of containing error bits. Establishing a likelihood of error for various sub-regions 512 can be based on a position of the active reference relative the bit distributions, a number of errors, an ability to effectively correct errors within the suspect sub-regions 512 (e.g., by swapping logical association of suspect bits within particular sub-regions), and so on. According to at least one aspect, likelihood of error for various sub-regions 512 can be updated during error correction based on results of prior bit correction operations.

Upon receiving suspect bits 504A and error probabilities 506 for one or more such bits, bit selection component 502 can obtain results 504B of prior subset correction instances, where applicable. Thus, if one or more subsets of bits have already been analyzed, those subsets can be ignored in favor of other subsets of bits that have not yet been analyzed. Once bit selection component 502 obtains the suspect bits, error probabilities 506 and previous results 504B, selection of a subset of the suspect bits can be determined. Such selection can be based on optimization (514) and/or machine learning. In order to infer a highest probability of error for one or more suspect bits, an optimization component 514 can utilize a set of models (e.g., device/technology error model, bit error history models, bit-level state charge loss model, etc.) in connection with determining or inferring probability of error for suspect bits 504A. The models can be based on a plurality of information (e.g., results of prior correction instances, dynamic parameters, such as variations in suspect range, locations of suspect sub-regions relative an active reference, etc.). Optimization routines associated with optimization component 514 can harness a model that is trained from previously collected data, a model that is based on a prior model that is updated with new data, via model mixture or data mixing methodology, or simply one that is trained with seed data, and thereafter tuned in real-time by training with actual field data based on parameters modified as a result of error correction instances.

In addition, optimization component 514 can employ learning and reasoning techniques in connection with making determinations or inferences regarding optimization decisions, such as modifying suspect bit error probabilities 506 based on updated suspect sub-regions 512 and/or prior results 504B. For example, optimization component 514 can employ a probabilistic-based or statistical-based approach in connection with modifying the error probabilities 506. Inferences can be based in part upon explicit training of classifier(s) (not shown), or implicit training based at least upon one or more monitored results 504B, and the like, in conjunction with selecting subsets of suspect bits 504A.

Optimization component 514 can also employ one of numerous methodologies for learning from data and then drawing inferences from the models so constructed (e.g., Hidden Markov Models (HMMs) and related prototypical dependency models, more general probabilistic graphical models, such as Bayesian networks, e.g., created by structure search using a Bayesian model score or approximation, linear classifiers, such as support vector machines (SVMs), non-linear classifiers, such as methods referred to as "neural network" methodologies, fuzzy logic methodologies, and other approaches that perform data fusion, etc.) in accordance with implementing various aspects described herein. Methodologies employed by optimization component 514 can also include mechanisms for the capture of logical relationships such as theorem provers or heuristic rule-based expert systems. Inferences derived from such learned or manually constructed models can be employed in other optimization techniques, such as linear and non-linear programming, that seek to maximize probabilities of error. For example, maximizing an overall relationship/relevancy between error probabilities (506) and prior correction results (504B) can be achieved through such optimization techniques.

Figure 6A:
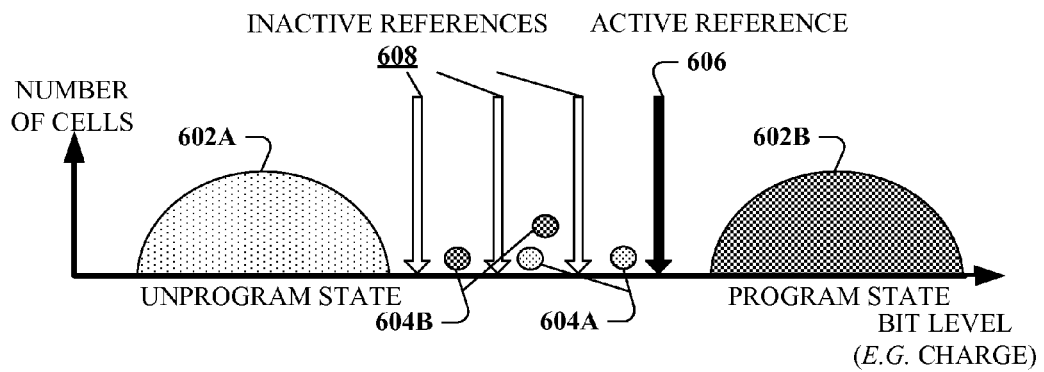
FIG. 6 depicts example bit state distributions in conjunction with optimizing a bit error suspect region according to additional aspects.
Figure 6B:
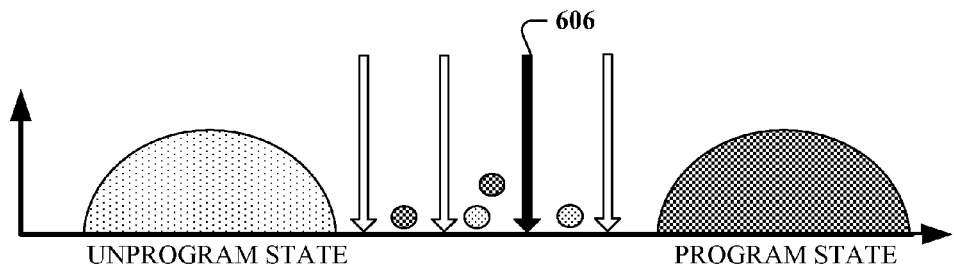
Figure 6C:
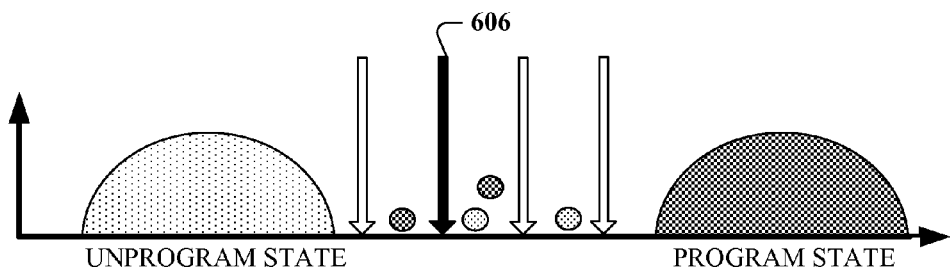

FIGS. 6A, 6B and 6C depict example suspect region sub-zones according to aspects of the subject disclosure. A plurality of bit-level reference (606, 608) can be established between bit-level distributions 602A, 602B of memory cells analyzed for error correction as described herein. Outer references (606, 608) can establish a general suspect region between the distributions 602A, 602B (e.g., the left-most and right-most references depicted). One or more references between the outer comparators can define suspect sub-regions within the general suspect region. A bit within the general suspect region are classified as suspect bits, and can also be associated with a suspect sub-region that the bit falls within. As described above with respect to FIG. 5, a suspect bit can be accorded a probability of error based at least in part on a suspect sub-region associated with the bit.

In at least some aspects of the subject disclosure, an active reference 606 can be selected out of the references 606, 608. The active reference 606 is utilized to establish a bit-level state cut-off between the two bit-level distributions depicted at FIGS. 6A, 6B and 6C. Thus, as an example, the active reference 606 can establish a cut-off between an un-programmed state (602A) and a programmed state (602B). Based on the cut-off established by the active reference 606, a number of errors can be determined for the bit-level distributions 602A, 602B. Thus, as depicted at FIG. 6A, when the active reference 606 is the right-most reference (606, 608), two bits 604B associated with the program state distribution 602B are on an opposite side of the active reference 606 as compared with the program state distribution 602B, and thus are errors. Accordingly, FIG. 6A comprises two error bits (604B) based on selecting the right-most reference (606, 608) as the active reference 606.

At FIG. 6B, the second right-most reference is selected as the active reference 606 (depicted by the darkened arrow). Other references are inactive references 608, and contribute to establishing a suspect region and respective sub-regions, but are not utilized to establish a cut-off bit-level between the programmed distribution 602B and un-programmed distribution 602A. As depicted, two program state bits and one un-program state bit are on opposites sides of the active reference 606 as their respective distributions. Accordingly, selection of the second right-most reference as the active reference results in three error bits. At FIG. 6C, the second left-most reference is selected as the active reference 606, also resulting in three bit errors (on program state bit and both un-program state bits within the general suspect region). Although not depicted, it can readily be determined that selecting the left-most reference as the active reference results in two bit errors as well (both un-program bits within the general suspect region are errors if the left-most reference is selected as the active reference).

In at least one aspect of the subject disclosure, error correction can include optimization of references locations and/or selection of the active reference 606. Thus, for instance, an active reference 606 resulting in fewest bit errors (e.g., the right-most reference as depicted at FIG. 6A) can be selected as a starting point for further error correction as described herein. By minimizing a number of errors, simpler detection/correction algorithms can be employed for error correction, such as a Hamming code or extended Hamming code employing iterative bit swapping of suspected error bits.

The aforementioned systems have been described with respect to interaction between several components, modules and/or communication interfaces. It should be appreciated that such systems and components/modules/interfaces can include those components or sub-components specified therein, some of the specified components or sub-components, and/or additional components. For example, a system could include error detection-correction 104, bit-level measurement component 108, and optimization component 214, or a different combination of these and other components. Sub-components could also be implemented as components communicatively coupled to other components rather than included within parent components. Additionally, it should be noted that one or more components could be combined into a single component providing aggregate functionality. For instance, error detection component 304 can include error correction component 308, or vice versa, to facilitate detection and correction of memory cell bit errors by way of a single component. The components can also interact with one or more other components not specifically described herein but known by those of skill in the art.

Furthermore, as will be appreciated, various portions of the disclosed systems above and methods below may include or consist of artificial intelligence or knowledge or rule based components, sub-components, processes, means, methodologies, or mechanisms (e.g., support vector machines, neural networks, expert systems, Bayesian belief networks, fuzzy logic, data fusion engines, classifiers . . . ). Such components, inter alia, and in addition to that already described herein, can automate certain mechanisms or processes performed thereby to make portions of the systems and methods more adaptive as well as efficient and intelligent.

In view of the exemplary systems described supra, methodologies that can be implemented in accordance with the disclosed subject matter will be better appreciated with reference to the flow charts of FIGS. 7-10. While for purposes of simplicity of explanation, the methodologies are shown and described as a series of blocks, it is to be understood and appreciated that the claimed subject matter is not limited by the order of the blocks, as some blocks can occur in different orders and/or concurrently with other blocks from what is depicted and described herein. Moreover, not all illustrated blocks can be required to implement the methodologies described hereinafter. Additionally, it should be further appreciated that the methodologies disclosed hereinafter and throughout this specification are capable of being stored on an article of manufacture to facilitate transporting and transferring such methodologies to computers. The term article of manufacture, as used, is intended to encompass a computer program accessible from any computer-readable device, device in conjunction with a carrier, or storage medium.

Figure 7:
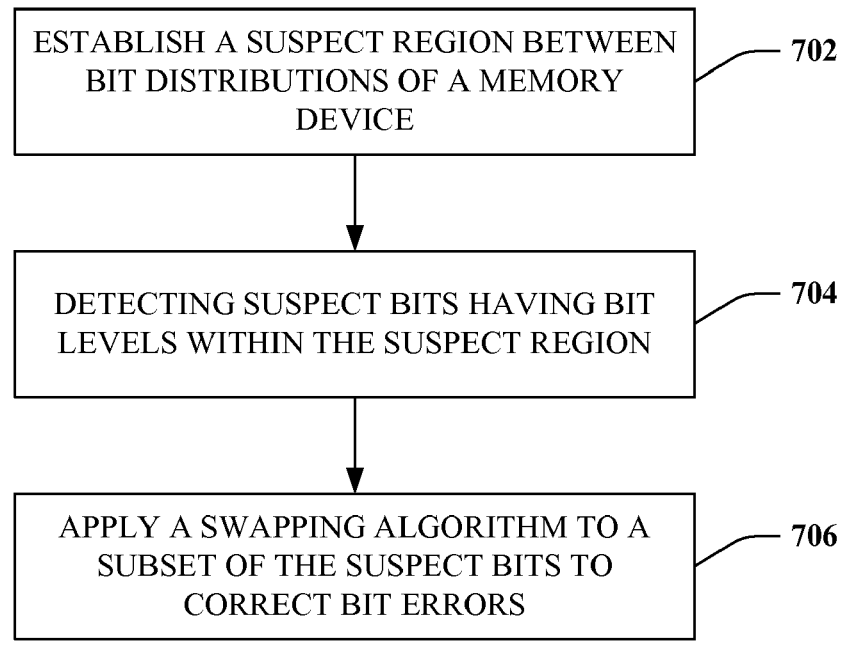
FIG. 7 illustrates a flowchart of an example methodology for correcting errors of an electronic memory device according to further aspects.

FIG. 7 illustrates a flowchart of an example methodology 700 for correcting errors of an electronic memory device according to aspects of the subject disclosure. At 702, method 700 can establish a suspect region between bit-level distributions of a memory device. The suspect region can be generated utilizing a plurality of reference comparators located between the distributions. At 704, method 700 can detect suspect bits having bit-levels within the suspect region. For instance, a selected group of bits of the memory cell device (e.g., a block or page, such as 256 bits) can be analyzed with respect to the reference comparators. Specifically, bit-levels of the analyzed bits can be measured and compared with bit-levels of the references. If a measured bit-level falls within the suspect region, the bit can be identified as a suspect bit. Thus, all analyzed bits having measured bit-levels within the suspect region can form a set of suspect bits. At 706, method 700 can apply a swapping algorithm to a subset of the suspect bits to implement error correction. Application of the swapping algorithm can be based at least in part on determining one or more bit errors for the bit-level distributions (e.g., determined with respect to an active reference). Bit errors can be determined with Hamming code in some aspects, or in other aspects, with program and read codewords generated by a summation algorithm, as described herein. The swapping algorithm can change a logical association of each of the suspect bits. Thus, if a suspect bit is an error bit, changing its logical association can result in 'correction' of the bit, in that the swapped bit matches a bit-level state obtained when the memory device was last programmed.

Figure 8:
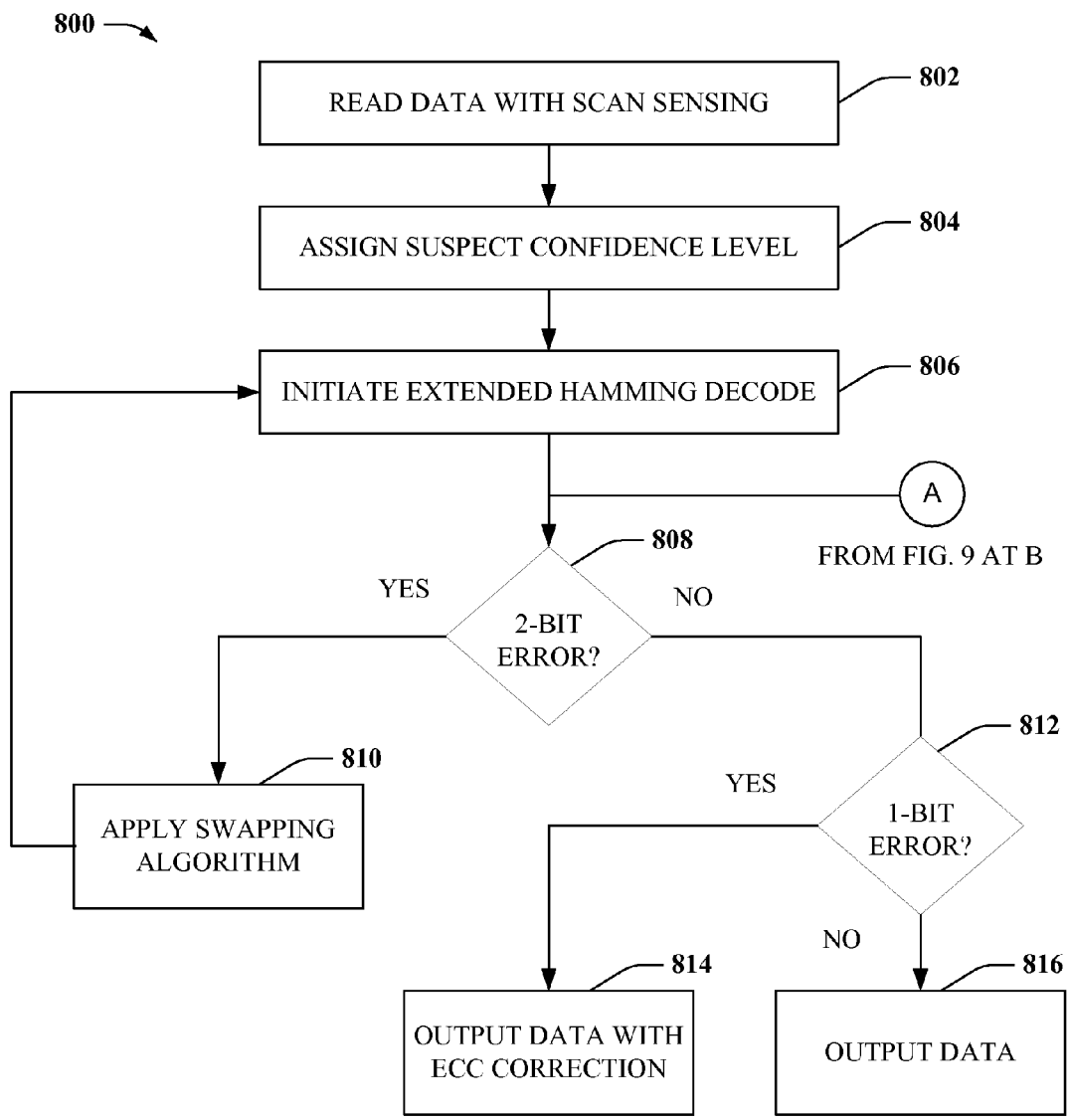
FIG. 8 illustrates a flowchart of an example methodology for employing Hamming code in correcting bit errors of electronic memory.

FIG. 8 illustrates a flowchart of an example methodology 800 for employing extended Hamming code in correcting bit errors of electronic memory. At 802, method 800 can employ scan sensing to read data stored in memory cells of a memory device. Scan sensing can comprise, for instance, measuring bit-levels of the memory cells and comparing the measured bit-levels with one or more reference comparators. Bit-levels falling within a suspect region established between two bit-level state distributions can comprise a set of suspected or potential error bits.

At 804, method 800 can assign suspect confidence levels to one or more suspected error bits. The confidence levels can be based on a probability that a suspected error bit is an actual error bit. Such probability can be determined based on various information, such as proximity of a measured bit-level to a cut-off between the two bit-level state distributions, physical characteristics of the measured memory cells, operation history of the memory device (e.g., number of read, write, erase and/or refresh operations conducted since last programming), error history of a memory cell (e.g., is the cell prone to losing/gaining stored charge), technical specifications of the memory cell (e.g., is it a NOR cell, NAND cell, mirror-bit cell, etc.), or the like or a combination thereof. At 806, method 800 can initiate extended Hamming decode analysis to detect for bit errors and correct up to one error. At 808, method 800 can determine whether a two-bit error is output from the extended Hamming code. The determination can be made, for instance, by comparing a program codeword for analyzed data, generated upon programming the data, with a read codeword generated after completing the extended Hamming decode at reference number 806. Since extended Hamming decode can correct only a single error, if the program and read codewords match (and thus the data is correct), the data read with scan sensing at reference number 802 comprised only one or zero errors. If the codewords do not match, the data comprised two or more errors. If two or more errors exist (e.g., determined because the codewords do not match), method 800 can proceed to 810; otherwise, method 800 outputs the data from the extended Hamming code at reference number 814.

At 810, method 800 can identify previously un-swapped suspect region bits. Such bits can be identified based on a tag or label stored with respect to each bit, or a list stored identifying swapped/un-swapped bits, or the like. At 812, method 800 can apply a swapping algorithm to a subset of the un-swapped suspect bits. At 814, method 800 can label each swapped bit (e.g., utilizing a label for each bit, or by updating a list of swapped/un-swapped bits) to distinguish swapped and un-swapped bits. In some aspects, labeling swapped bits can enable such bits to be ignored by subsequent application of the swapping algorithm. Accordingly, subsequent iterations of reference numbers 806, 808 and 810 can be limited to only select un-"swapped" bits, where appropriate, for application of the swapping algorithm. Hence, a number of remaining bits to be swapped decreases after application of the swapping algorithm at reference number 810. It should also be appreciated that suspect bits swapped by the extended Hamming decode at reference number 806 can also be labeled at reference number 814 (e.g., to prevent un-swapping of 'corrected' bits). After applying the swapping algorithm to select un-swapped suspect bits, method 800 can return to reference numbers 806 and 808 to determine whether any remaining errors exist utilizing the extended Hamming code.

Figure 9:
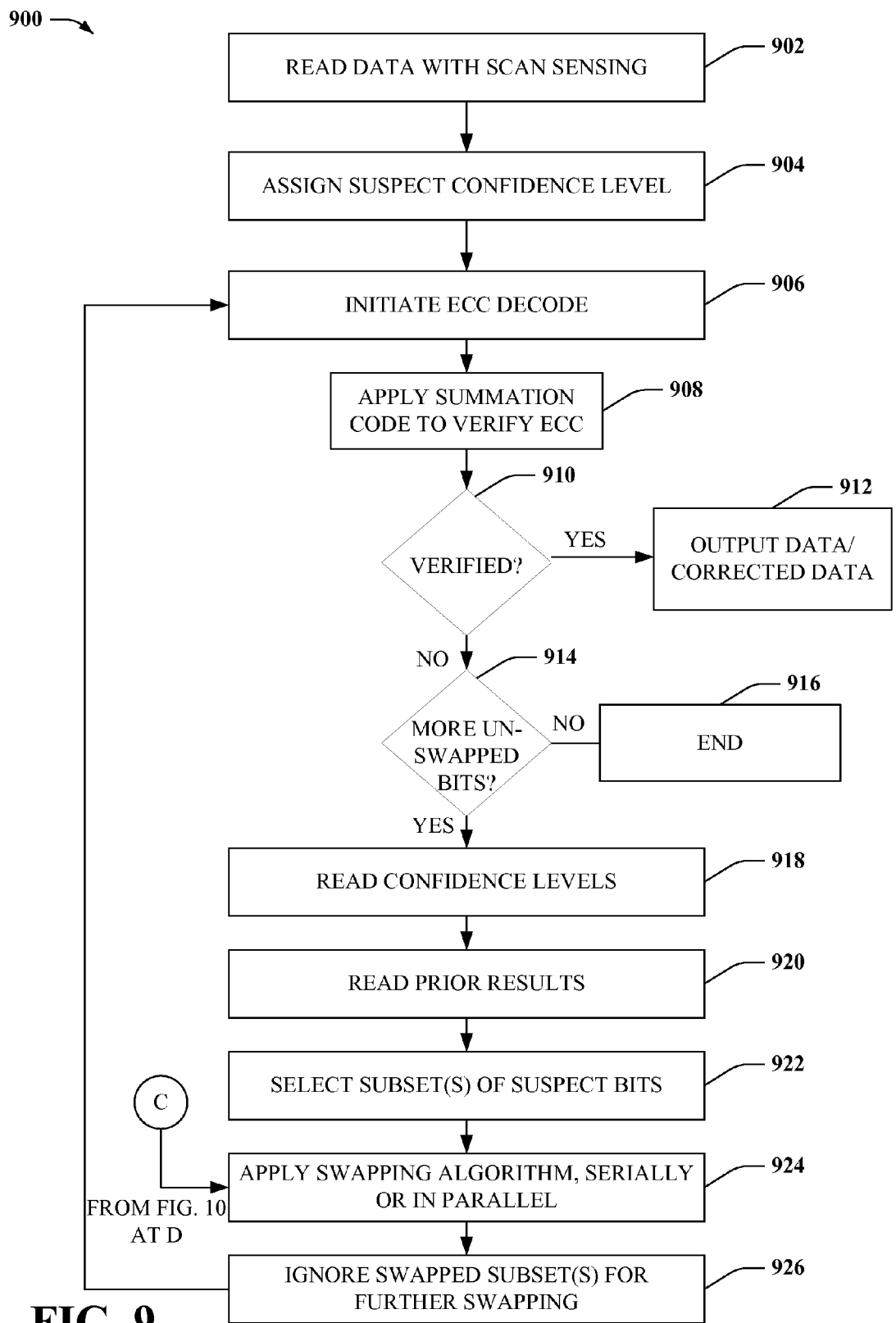
FIG. 9 illustrates a flowchart of an example methodology for correcting multi-bit errors for electronic memory according to additional aspects.

FIG. 9 illustrates a flowchart of an example methodology 900 for correcting multi-bit errors for electronic memory according to additional aspects of the subject disclosure. At 902, method 900 can read data utilizing scan sensing to establish measured bit-level distributions of the data. A plurality of reference comparators can be established between at least two of the bit-level distributions to generate a suspect region. Bit-levels falling within the suspect region are categorized as suspected error bits. At 904, method 900 can assign a confidence level for the suspected error bits, as described herein. At 906, an ECC decode is utilized to analyze the bit level distributions, comprising at least the suspected error bits, for actual errors. The ECC can comprise any suitable bit distribution error correction code, such as extended Hamming code, RS code or BCH code, or the like, or a suitable combination thereof.

At 908, method 900 employs a summation algorithm to verify the results of the ECC decode. The summation algorithm can involve comparing a program codeword ($CW_P$) established upon programming analyzed data with a read codeword ($CW_R$) generated when the data is read. If $CW_P = CW_R$, then the results of the ECC are verified. Otherwise, if $CW_P \neq CW_R$, the ECC decode failed to detect or correct all errors at reference number 906, and the results of the ECC are not verified.

At 910, method 900 determines whether the summation algorithm verifies the results of the ECC. If the results are verified, method 900 proceeds to 912 where data analyzed by the ECC at reference number 906 is output. If, on the other hand, the ECC results are not verified by the summation algorithm, method 900 proceeds to 914. At 914, a determination is made as to whether the suspect region comprises any suspect bits that have not been previously swapped for ECC analysis. If un-swapped suspect bits remain, method 900 can proceed to 918. If no un-swapped suspect bits remain, method 900 can proceed to 916 and terminate combined ECC and suspect bit swapping error correction algorithms. Optionally, a multi-error EDC correction code can be employed at 916 after terminating the ECC+swapping algorithms.

At 918, method 900 can read confidence levels established for the suspect bits. A confidence level can provide a probability for error of one or more suspect bits based on various factors associated with the suspect bit(s), including suspect sub-regions associated with the suspect bit(s), bit-level state of the suspect bit(s), error history for such bit(s), prior error correction analysis applied to the bit(s), or the like, or a combination thereof. At 920, method 900 can optionally read results of prior correction instances involving the suspect bits, to distinguish previously swapped suspect bits from un-swapped bits. At 922, method 900 can select one or more subsets of the suspect bits for analysis (e.g., from a pool of un-swapped suspect bits). The selection can ignore previously swapped suspect bits (e.g., swapped at reference number 924, below) to efficiently converge to a suitable solution. At 924, a swapping algorithm is applied to the selected subset or subsets of suspect bits, to change logical association of a bit(s) as described herein. The swapping algorithm can be applied serially (e.g., where a single subset is swapped) or in parallel (e.g., where multiple subsets are swapped concurrently). At 926, method 900 can label the swapped bits to be skipped by subset selection and further swapping at reference number 922. Optionally, bits that are swapped as part of the ECC decode at reference number 906 can be labeled as well, to prevent un-swapping of bits "corrected" by the ECC decode.

From reference number 926, method 900 can proceed to reference number 906. When repeated at 906, the ECC decode analyzes an error state of the bit-level distributions (e.g., whether errors exist) after the swapping at reference number 924. The repeated analysis can therefore facilitate determining whether the swapping at reference number 924 reduced, increased or did not change the number of errors for the analyzed bit-level distributions. Method 900 can repeat reference numbers 906-910, 914 and 918-926 until ECC results are verified and data is output at reference number 912, or until no more un-swapped suspect bits are identified at reference number 914.

Figure 10:
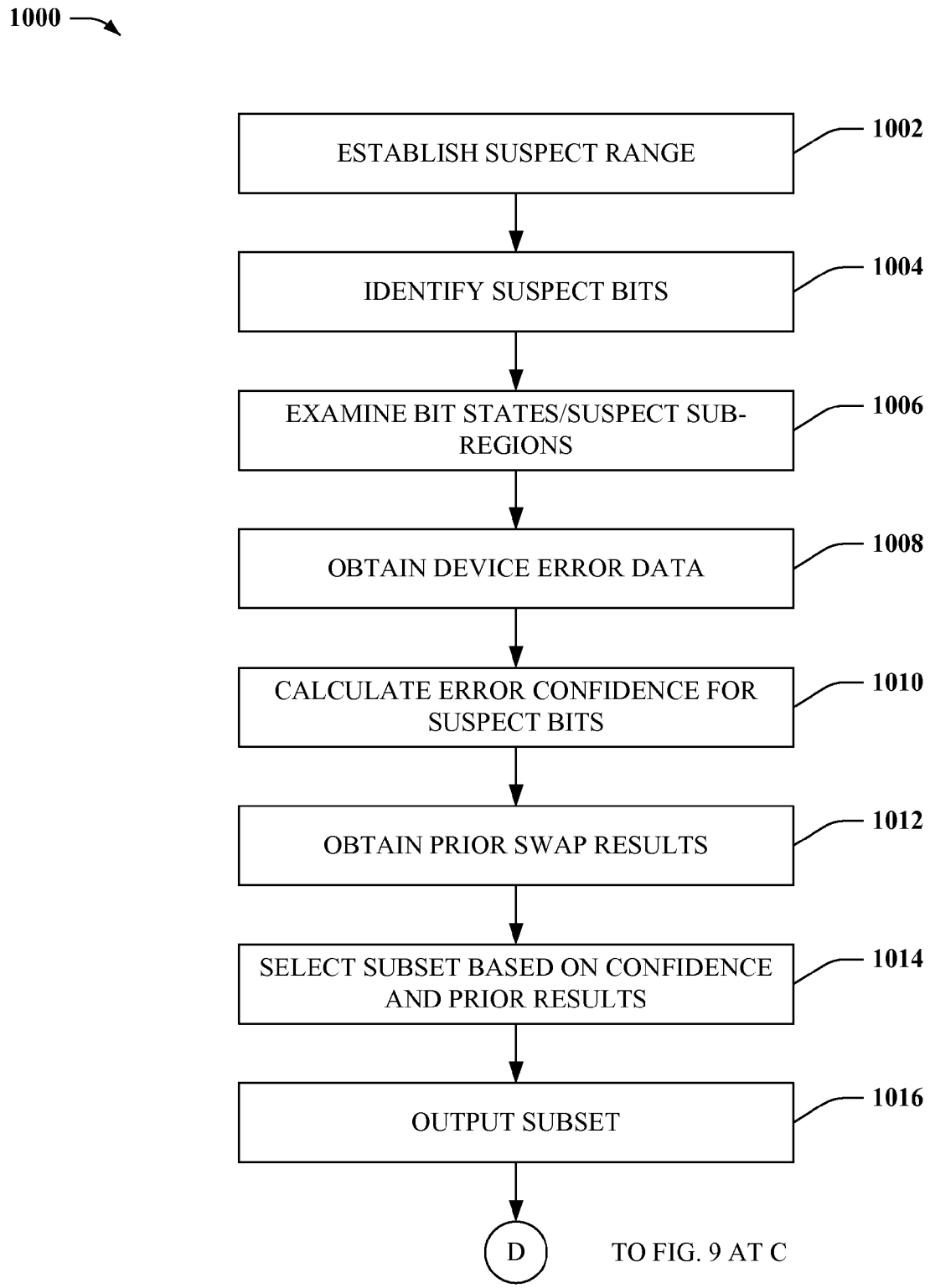
FIG. 10 depicts a flowchart of an example methodology for selecting suspected error bits for iterative correction according to further aspects.

FIG. 10 depicts a flowchart of an example methodology 1000 for selecting suspected error bits for iterative correction according to further aspects. At 1002, method 1000 can establish a suspect region, optionally comprising one or more suspect sub-regions, between bit-level distributions of a memory device. At 1004, method 1000 can identify suspect bits, having bit-levels that fall within the suspect region. Additionally, at 1006, method 1000 can examine bit level states of the suspect bits and/or suspect sub-regions associated with such bits. At 1008, method 1000 can obtain device error data based on physical characteristics of a memory device or cells of such device, as described herein. At 1010, method 1000 can calculate error confidence levels for one or more of the suspect bits (optionally, method 1000 can re-calculate error confidence levels for the one or more suspect bits for each instance in which the bits are read, since each read could conceivably produce a different result). An error confidence level of a suspect bit can be based on the bit-level state of the bit, an associated sub-region and its proximity to a cut-off between bit-level states, error history of the bit (e.g., where a block of physical storage has a tendency to lose data, a frequency of data loss could be integrated into the error confidence level), or device error data, or a combination thereof. At 1012, method 100 can obtain results of prior swap operations involved in correcting suspect region bits, where applicable. At 1014, method 1000 can select a subset of the suspect bits based at least in part on the confidence levels and/or prior results. At 1016, method 1000 can output the selected subset of suspect bits. For instance, the selected subset can be output to facilitate swapping logical association of the subset of suspect bits in conjunction with error detection/correction at reference C of FIG. 9.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

In particular and in regard to the various functions performed by the above described components, devices, circuits, systems, methods and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the subject matter includes a system as well as a computer-readable medium having computer-executable instructions for performing the acts and/or events of the various methods. In addition, while a particular feature may have been disclosed with respect to only one of several implementations, such feature may be combined with one or more other features of the other implementations as may be desired and advantageous for any given or particular application.

Artificial intelligence based systems (e.g., explicitly and/or implicitly trained classifiers) can be employed in connection with performing inference and/or probabilistic determinations and/or statistical-based determinations as in accordance with one or more aspects of the disclosed subject matter as described herein. As used herein, the term "inference," "infer" or variations in form thereof refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

Additionally, some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

Figure 11:
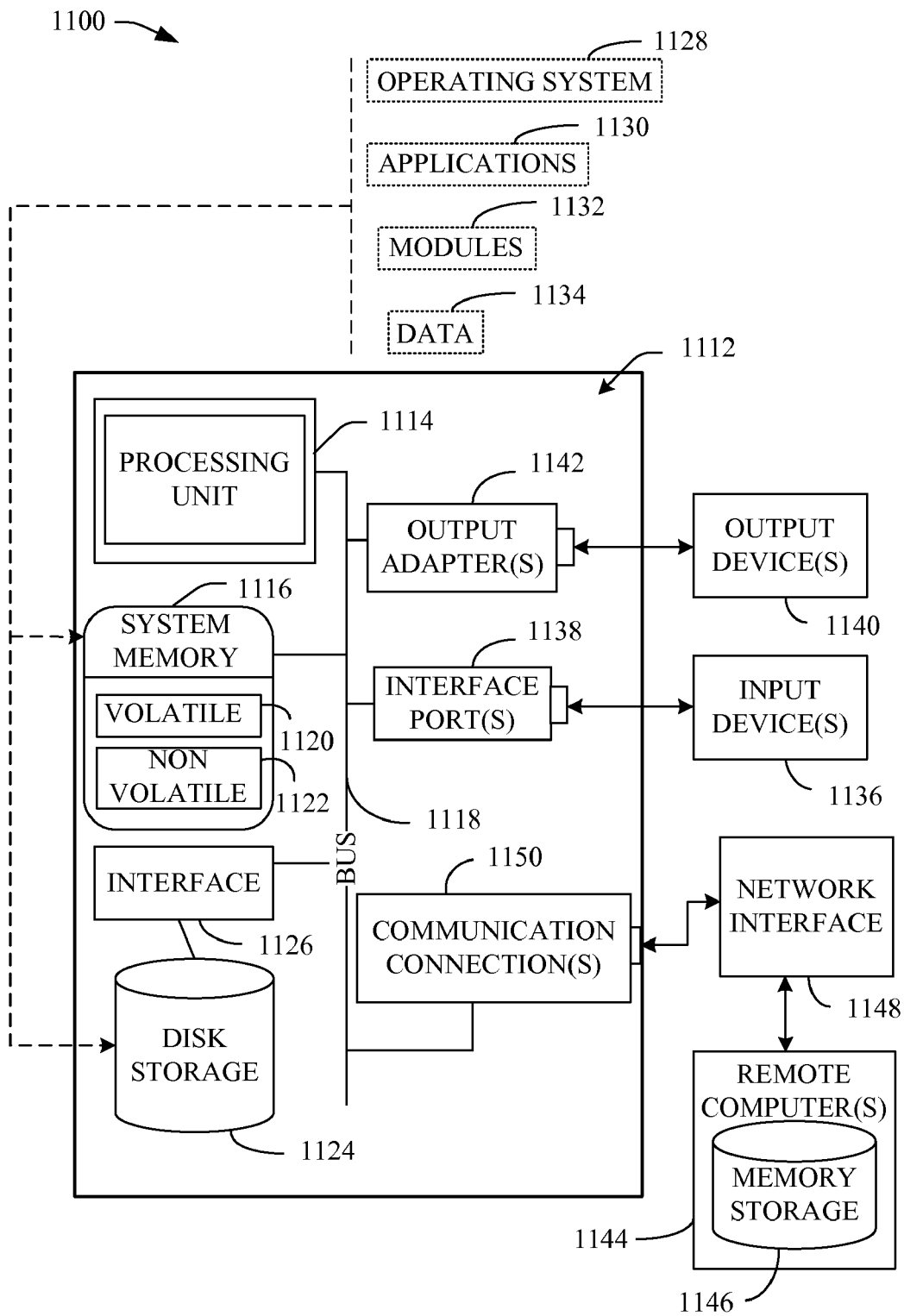
FIG. 11 illustrates a block diagram of an example operating environment that can interface with electronic memory according to some aspects.

In order to provide a context for the various aspects of the disclosed subject matter, FIG. 11, as well as the following discussion, are intended to provide a brief, general description of a suitable environment in which the various aspects of the disclosed subject matter may be implemented. While the subject matter has been described above in the general context of instructions and/or system components of an electronic device and/or electronic processing device (e.g., a computer), those skilled in the art will recognize that the subject innovation also may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on standalone computers. In a distributed computing environment, program modules may be located in both local and remote memory storage devices.

With reference to FIG. 11, a suitable environment 1100 for implementing various aspects of the claimed subject matter can include a computer 1112. The computer 1112 includes a processing unit 1114, a system memory 1116, and a system bus 1118. The system bus 1118 couples system components including, but not limited to, the system memory 1116 to the processing unit 1114. The processing unit 1114 can be any of various available processors. Dual microprocessors and other multiprocessor architectures also can be employed as the processing unit 1114.

The system bus 1118 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 1116 includes volatile memory 1120 and nonvolatile memory 1122. The basic input/output system (BIOS), containing the basic routines to transfer information between elements within the computer 1112, such as during start-up, is stored in nonvolatile memory 1122. By way of illustration, and not limitation, nonvolatile memory 1122 can include ROM, PROM, electrically programmable ROM (EPROM), electrically erasable programmable ROM (EEPROM), or flash memory. Volatile memory 1120 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1112 also includes removable/non-removable, volatile/non-volatile computer storage media. FIG. 11 illustrates, for example, a disk storage 1124. Disk storage 1124 includes, but is not limited to, devices like a magnetic disk drive, floppy disk drive, tape drive, Jaz drive, Zip drive, LS-100 drive, flash memory card, or memory stick. In addition, disk storage 1124 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1124 to the system bus 1118, a removable or non-removable interface is typically used, such as interface 1126.

It is to be appreciated that FIG. 11 describes software that can be configured act as an intermediary between users and the basic computer resources described in the suitable operating environment 1100. Such software includes an operating system 1128. Operating system 1128, which can be stored on disk storage 1124, acts to control and allocate resources of the computer system 1112. System applications 1130 take advantage of the management of resources by operating system 1128 through program modules 1132 and program data 1134 stored either in system memory 1116 or on disk storage 1124. It is to be appreciated that the disclosed subject matter can be implemented with various operating systems or combinations of operating systems.

A user enters commands or information into the computer 1112 through input device(s) 1136. Input devices 1136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1114 through the system bus 1118 via interface port(s) 1138. Interface port(s) 1138 include, for example, a serial port, a parallel port, a game port, and a universal serial bus (USB). Output device(s) 1140 use some of the same type of ports as input device(s) 1136. Thus, for example, a USB port may be used to provide input to computer 1112 and to output information from computer 1112 to an output device 1140. Output adapter 1142 is provided to illustrate that there are some output devices 1140 like monitors, speakers, and printers, among other output devices 1140, which require special adapters. The output adapters 1142 include, by way of illustration and not limitation, video and sound cards that provide a means of connection between the output device 1140 and the system bus 1118. It should be noted that other devices and/or systems of devices provide both input and output capabilities such as remote computer(s) 1144.

Computer 1112 can operate in a networked environment using logical connections to one or more remote computers, such as remote computer(s) 1144. The remote computer(s) 1144 can be a personal computer, a server, a router, a network PC, a workstation, a microprocessor based appliance, a peer device or other common network node and the like, and typically includes many or all of the elements described relative to computer 1112. For purposes of brevity, only a memory storage device 1146 is illustrated with remote computer(s) 1144. Remote computer(s) 1144 is logically connected to computer 1112 through a network interface 1148 and then physically connected via communication connection 1150. Network interface 1148 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1150 refers to the hardware/software employed to connect the network interface 1148 to the bus 1118. While communication connection 1150 is shown for illustrative clarity inside computer 1112, it can also be external to computer 1112. The hardware/software necessary for connection to the network interface 1148 includes, for exemplary purposes only, internal and external technologies such as, modems including regular telephone grade modems, cable modems and DSL modems, ISDN adapters, and Ethernet cards.

What is claimed is:

1. A system that corrects bit errors in a memory device, comprising:
  a sensing circuit configured to measure bit levels of a set of memory cells;
  a reference component that compiles at least a subset of the measured bit levels into two bit level distributions and establishes a region between the two bit level distributions, the region defines suspected error bits of the two bit level distributions; and an error detection component that applies an error detection code (EDC) algorithm to the suspected error bits that is configured to identify whether multiple error bits exist among the suspected error bits, wherein the error detection component is further configured to apply a swapping algorithm configured to change a logical association of one of the suspected error bits to facilitate reducing a number of the multiple error bits, in response to the EDC identifying multiple error bits, further wherein the error detection component is configured to identify the one of the suspected error bits as an error bit in response to the number of the multiple error bits decreasing following applying the swapping algorithm.

2. The system of claim 1, further comprising an error correction component that employs an error correction code (ECC) in conjunction with the EDC and swapping algorithm to correct bit errors outside the region.

3. The system of claim 1, further comprising a probability component that determines a probability of error for suspected error bits, the error detection component orders the swapping of suspect error bits according to the probability of error.

4. The system of claim 3, the probability component determines the probability of codeword error for the suspected error bit based at least on a bit level or suspect sub-region of the suspected error bit.

5. The system of claim 1, the error detection component distinguishes suspected error bits swapped by the swapping algorithm from un-swapped suspected error bits.

6. The system of claim 1, the EDC algorithm comprises an extended Hamming code.

7. The system of claim 1, the error detection component iteratively selects different subsets of the suspected error bits, applies the swapping algorithm to the selected subsets, and determines a number of remaining bit errors.

8. The system of claim 1, the reference component employs at least three reference comparators to establish the region, the region comprising:
an active reference comparator utilized by the error correction component to determine error bits;
a first sub-comparator that, in conjunction with the active comparator, establishes at least one first suspect sub-region; and
a second sub-comparator that, in conjunction with the active comparator, establishes at least one second suspect sub-region.

9. A method of error correction for a memory device, comprising:
establishing a suspect region between two bit level distributions of the memory device, the suspect region defines potential error bits;
detecting suspect bits of the memory device having bit levels within the suspect region; and
applying a swapping algorithm to a subset of the suspect bits that facilitates correction of bit level errors by iteratively changing a logical bit level association of one or more of the suspect bits to modify a number of detected error bits among the two bit level distributions.

10. The method of claim 9, further comprising, determining whether a bit level distribution comprises an error bit relative to a bit level reference.

11. The method of claim 10, further comprising conditioning application of the swapping algorithm on determining the error bit.

12. The method of claim 9, further comprising:
identifying a non-error suspect bit of the suspect bits;
determining which of the two bit level distributions is associated with the non-error suspect bit; and
refreshing the non-error suspect bit to bring such non-error suspect bit within a bit level range of one of the bit level distributions determined to be associated with the non-error suspect bit.

13. The method of claim 9, further comprising employing two or more reference comparators to establish a bit level range for the suspect region.

14. The method of claim 13, further comprising:
iteratively selecting each reference comparator as an active reference;
determining a number of error bits relative each active reference;
establishing as a primary reference the reference comparator with the fewest relative error bits; and
applying the swapping algorithm or an ECC relative the primary reference.

15. The method of claim 9, further comprising:
employing an extended Hamming code algorithm to determine a number of error bits of the bit level distributions;
assigning a level of confidence to a plurality of suspect bits indicating a likelihood that a suspect bit is one of the error bits; and
applying the swapping algorithm to correct error bits in order of assigned confidence level.

16. The method of claim 15, further comprising:
distinguishing the subset of suspect bits swapped by the swapping algorithm from un-swapped bits; and
applying the swapping algorithm to a second subset of the suspect bits, the second subset comprising un-swapped bits.

17. The method of claim 9, further comprising employing a primary reference comparator and at least two secondary reference comparators to establish the suspect region and at least two sub-regions thereof, at least one sub-region is associated with an error confidence level.

18. The method of claim 17, further comprising establishing an error confidence level of a suspect bit within the at least one sub-region based on the error confidence level of such sub-region.

19. A system configured to correct error bits for non-volatile memory, comprising:
means for establishing a suspect region between two bit level distributions of the memory device, the suspect region defines potential error bits;
means for detecting suspect bits of the memory device having bit levels within the suspect region;
means for identifying whether a plurality of the suspect bits are error bits; and
means for applying a swapping algorithm in response to identifying the plurality of error bits, the swapping algorithm facilitates reducing a number of the error bits by changing a logical bit level association of a subset of the suspect bits, wherein the means for identifying whether the plurality of the suspect bits are error bits infers that the subset of the suspect bits comprises at least one of the error bits in response to determining that the number of the error bits is reduced.

20. A method of error correction for a memory device, comprising:
establishing a suspect region between two bit level distributions of the memory device, the suspect region defines potential error bits;

detecting suspect bits of the memory device having bit levels within the suspect region;

applying a swapping algorithm to a subset of the suspect bits that corrects bit level errors by changing a logical bit level association of a bit;

identifying a marginal non-error suspect bit of the suspect bits;

determining which of the two bit level distributions is associated with the non-error suspect bit; and refreshing the non-error suspect bit to bring such non-error suspect bit within a bit level range of one of the bit level distributions determined to be associated with the non-error suspect bit.

* * * * *